United States Patent [19]
Discenzo et al.

[11] Patent Number: 5,917,428
[45] Date of Patent: *Jun. 29, 1999

[54] INTEGRATED MOTOR AND DIAGNOSTIC APPARATUS AND METHOD OF OPERATING SAME

[75] Inventors: Frederick M. Discenzo, Brecksville; Perry A. DelVecchio, Mentor; Edward J. Tompkin, Cuyahoga Falls, all of Ohio

[73] Assignee: Reliance Electric Industrial Company, Cleveland, Ohio

[ * ] Notice: This patent issued on a continued prosecution application filed under 37 CFR 1.53(d), and is subject to the twenty year patent term provisions of 35 U.S.C. 154(a)(2).

[21] Appl. No.: 08/745,167

[22] Filed: Nov. 7, 1996

[51] Int. Cl.$^6$ ................................................ G08B 21/00
[52] U.S. Cl. .................. 340/870.01; 307/116; 340/648; 310/68 R; 310/68 B; 310/68 C
[58] Field of Search ....................... 376/245; 340/870.01, 340/870.17, 870.07, 870.05, 648; 364/146, 552; 324/177, 772; 73/659; 318/490; 310/68 R, 68 B, 68 C; 307/116

[56] References Cited

U.S. PATENT DOCUMENTS

| | | | |
|---|---|---|---|
| 4,063,112 | 12/1977 | Dumbeck | 307/116 |
| 4,101,831 | 7/1978 | Dumbeck | 324/166 |
| 4,194,178 | 3/1980 | Dumbeck | 340/870.17 |
| 4,236,092 | 11/1980 | DiFlora | 310/68 C |
| 4,430,681 | 2/1984 | Benzing | 361/27 |
| 4,965,513 | 10/1990 | Haynes et al. | 324/772 |
| 4,978,909 | 12/1990 | Hendrix et al. | 324/772 |
| 5,400,246 | 3/1995 | Wilson | 364/146 |
| 5,485,491 | 1/1996 | Salwick | 376/245 |
| 5,488,281 | 1/1996 | Unsworth et al. | 318/806 |
| 5,499,196 | 3/1996 | Pacheco | 364/552 |
| 5,521,482 | 5/1996 | Lang et al. | 318/800 |

*Primary Examiner*—Michael Horabik
*Assistant Examiner*—Albert K. Wong
*Attorney, Agent, or Firm*—John M. Miller; John J. Horn; William R. Walbrun

[57] ABSTRACT

A method and apparatus for real-time electric motor diagnostics and condition monitoring. While the motor is energized, dynamic operating parameters are determined and a notification signed is generated if predetermined criterion are satisfied. The diagnostic apparatus is integrated with the motor and includes a set of sensors, a processing unit, a memory and an output interface for communicating alarms, warnings and calculated operating parameter values or the like to a display device and to an external supervisor having wireless paging capability to alert a remote operator or maintenance personnel. In a normal operating mode, the processing unit calculates a general class of derived motor operating parameters such as over-temperature, over-voltage, over-current, excessive vibration, and phase imbalance. When an abnormal condition is observed, the processing unit modifies certain data acquisition parameters as necessary to effect an alternative data acquisition strategy which would more likely lead to data dispositive of the condition of the motor.

19 Claims, 9 Drawing Sheets

MOTOR CONDITION MONITORING PRE-ALERT
DATA FORMAT
MOTOR-PC VIA RS232C

| FIELD NO. | DATA FIELD NAME | SAMPLE VALUE | LENGTH (CHARS.) | TYPE |
|---|---|---|---|---|
| 1 | START OF MESSAGE-SOM NOTE: PC SENDS "R" TO MOTOR TO INITIATE TRANSMISSION OF FIELDS 1 THROUGH 17 | SOM | 3 | CHARACTER |
| 2 | GREEN LED-LEDGRN | 000.00-OFF 001.00-ON | 6 | FLOAT |
| 3 | YELLOW LED-LEDYEL | 000.00-OFF 000.00-ON | 6 | FLOAT |
| 4 | RED LED-LEDRED | 000.00-OFF 001.00-ON | 6 | FLOAT |
| 5 | INDEX OF FIELD CAUSING FAULT | 000.00 (0 OR 7 THRU 17) | 6 | FLOAT |
| 6 | MESSAGE TEXT-MSGTXT | CAUTION-MOTOR NOW AT 180 C | 40 | CHARACTER |
| 7 | CURRENT 1-CUR1 | 123.45 | 6 | FLOAT |
| 8 | CURRENT 2-CUR2 | 123.45 | 6 | FLOAT |
| 9 | CURRENT 3-CUR3 | 123.45 | 6 | FLOAT |
| 10 | VOLTAGE 1-VOLT1 | 123.45 | 6 | FLOAT |
| 11 | VOLTAGE 2-VOLT2 | 123.45 | 6 | FLOAT |
| 12 | VOLTAGE 3-VOLT3 | 123.45 | 6 | FLOAT |
| 13 | TEMPERATURE BEARING LOAD-TEMPLOAD | 123.45 | 6 | FLOAT |
| 14 | TEMPERATURE BEARING FAN-TEMPFAN | 123.45 | 6 | FLOAT |
| 15 | TEMPERATURE STATOR-TEMPSTATR | 123.45 | 6 | FLOAT |
| 16 | ACCELERATION-ACCEL | 123.45 | 6 | FLOAT |
| 17 | MAGNETIC FIELD-FLUX | 123.45 | 6 | FLOAT |
| 18-145 | SAMPLED CURRENT ONE PHASE ONLY- CURSAMP. TRANSMIT INITIATED BY PC SENDING MOTOR "A" | 123.45 | 6 X 128 (FIRST 128 SAMPLES) | FLOATS |
| 146-273 | SAMPLED CURRENT ONE PHASE ONLY- CURSAMP. TRANSMIT INITIATED BY PC SENDING MOTOR "B" | 123.45 | 6 X 128 (SECOND 128 SAMPLES) | FLOATS |
| 274-401 | SAMPLED CURRENT ONE PHASE ONLY- CURSAMP. TRANSMIT INITIATED BY PC SENDING MOTOR "C" | 123.45 | 6 X 128 (THIRD 128 SAMPLES) | FLOATS |
| 402-529 | SAMPLED CURRENT ONE PHASE ONLY- CURSAMP. TRANSMIT INITIATED BY PC SENDING MOTOR "D" NOTE-SENDING "D" TO MOTOR ALSO CAUSES ANOTHER 512 TO BE TAKEN. | 123.45 | 6 X 128 (LAST 128 SAMPLES-COMPLETES THE 512 WAVEFORM) | FLOATS |

NOTE THAT FIELD LENGTHS INCLUDES ANY SIGNS.

FIG. 8

INTEGRATED MOTOR AND DIAGNOSTIC APPARATUS AND METHOD OF OPERATING SAME

BACKGROUND OF THE INVENTION

1. Field of Invention

The present invention relates to diagnostic apparatus and techniques for diagnosing and predicting failure in industrial machinery and, more particularly, to methods and apparatus for diagnosing the condition of rotating electrical and other machinery such as motors, generators, and gears wherein the diagnostics are integrated within the motor, generator, gear or other device.

2. Description of the Prior Art

A number of motor diagnostic methods and apparatus have been proposed in both the laboratory setting and elsewhere. U.S. Pat. No. 5,488,281 to Unsworth, et al. teaches a method and apparatus for predicting motor winding failure using zero crossing times. In that system, a motor controller is utilized which provides stator winding currents at a frequency of X cycles per second whereby the zero crossing times may be controlled and observed. In order to detect the zero crossing times and thus predict motor failure, the control system of the Unsworth, et al. apparatus alters the RMS supply line current by controlling the period of a notch introduced into the supply voltage each time the associated line current becomes zero. Thus, during the duration of the notch, a thyristor pair disposed in series with the motor lead wires operate as an open circuit. In that manner, instead of observing the sinusoidal supply voltage at the motor terminals, an internally generated motor back EMF voltage may be observed by the controller. Thus, in the Unsworth, et al. system, active motor control must be interrupted in order to detect and predict motor winding failures. Further, while the active motor control is interrupted, additional active inputs or signals must be introduced into the motor control circuit in order to induce the creation of observable motor parameters necessary to predict or conclude motor winding failures.

Another method and apparatus for determining the mechanical performance of polyphase electric motor systems is described in U.S. Pat. No. 5,521,482 to Lang et al. There, a fairly complicated apparatus is connected to the power lead wires connecting the motor to a power source. A plurality of signal conditioners are provided in order to generate signal levels suitable for use by a set of analog digital converters whereby the conditioned analog signals are converted to a digital representation thereof. A multiplexer is interposed between a central computer and the set of analog to digital converters thereby relieving the computer of the task of simultaneously reading each of the digital signals as they are generated in parallel. The computer is in turn connected to a communications port, a keyboard, a memory, a display unit and a printer. Although the above system may provide a method and apparatus for determining the electrical and mechanical performance parameters of a polyphase electric motor system in a laboratory or the like, it is not well suited for real time diagnosis of a motor operating in an industrial application.

The present invention overcomes many of the problems of the present conventional monitoring apparatus and techniques by providing a method and apparatus well suited for diagnosing motor conditions in the field while the motor is in use in production or the like. The present apparatus provides an integrated motor and motor diagnostic tool capable of passive observation of the operating parameters in an unobtrusive manner and thus without interference to the process to which the motor is connected. Further, the present invention provides the capability of alerting an operator of various motor fault conditions as they occur and, in addition, to alerting the operator of less serious cautions regarding the operation of the motor as well.

SUMMARY OF THE INVENTION

Briefly stated, the present invention includes a diagnostic method and apparatus ideally suited for use with an electric motor of the type having a rotor, a stator, at least one bearing supporting the rotor, and a plurality of motor lead wires carrying electric current to the motor. Other applications are contemplated as well including electric generators, gear boxes, and in systems including "embedded motors" such as in consumer appliances or the like. The diagnostic apparatus according to the present invention includes at least one sensor in the motor for measuring a first physical condition of the motor and generating a first physical condition signal based on the measured first physical condition. A processing unit in the diagnostic apparatus is connected to the at least one sensor for determining the first operating condition of the motor based on the first physical condition signal. The processing unit generates an abnormal motor operation signal when the determined first operating condition is in a predetermined range. Further within the diagnostic apparatus, a signal communicating unit is responsive to the abnormal motor operation signal from the processing unit and communicates a motor diagnostic signal from the diagnostic apparatus to another device, a human, or any other supervisory control via a display unit or by wireless alphanumeric paging techniques.

BRIEF DESCRIPTION OF THE DRAWINGS

The invention may take physical form in certain parts and arrangements of parts, preferred embodiments of which will be described in detail in this specification and illustrated in the accompanying drawings which form a part hereof and wherein:

FIG. 8 illustrates the motor condition and diagnosis parameter data exchanged between the motor and integrated diagnostic apparatus illustrated in FIGS. 2 and 3 and the supervisory computer and alphanumeric paging system shown in FIG. 1; and, FIG. 9 illustrates the present invention used in an application for monitoring the operating performance of driven equipment downstream of the motor.

DETAILED DESCRIPTION OF THE PREFERRED EMBODIMENTS

Figure 1:
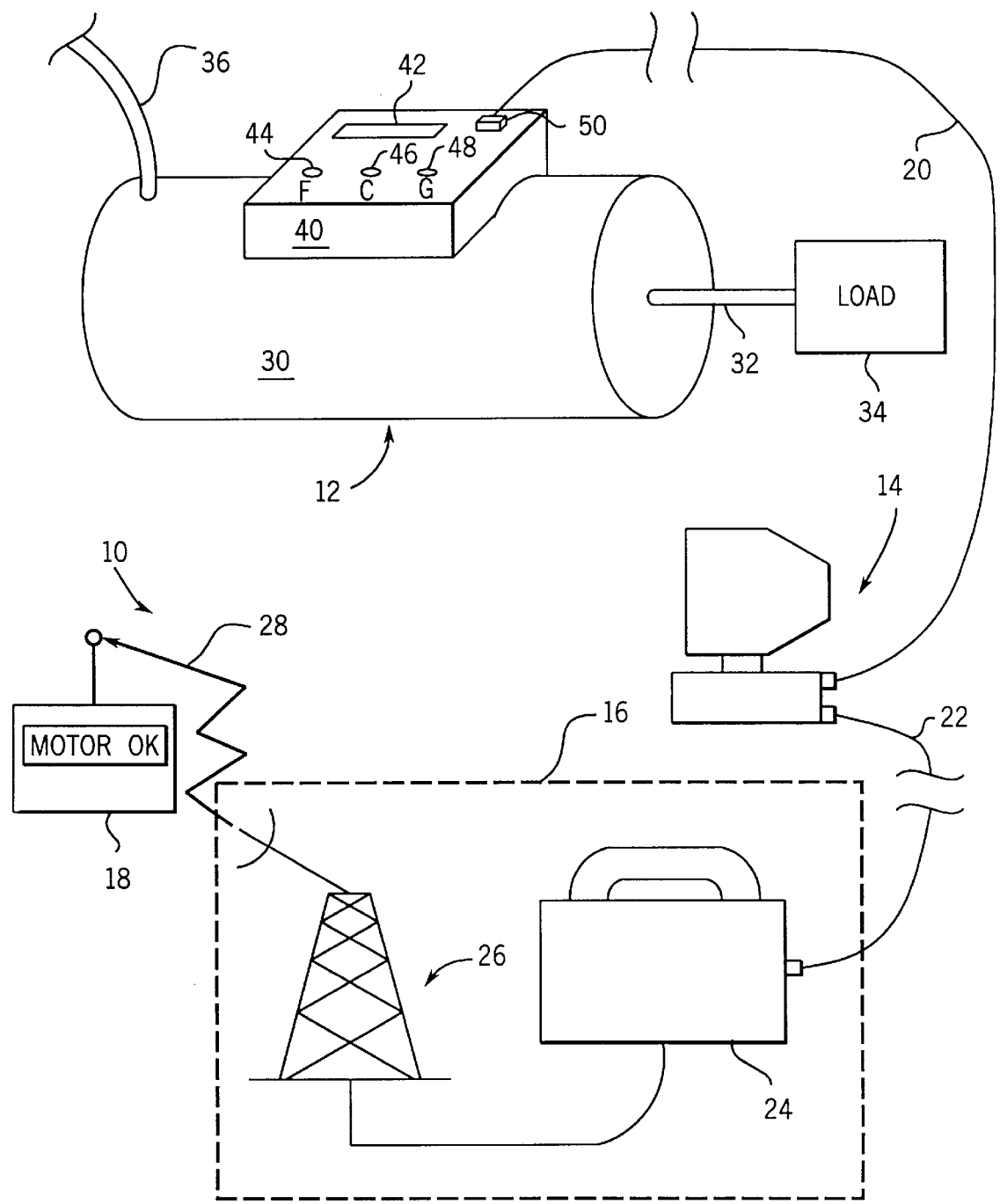
FIG. 1 is a perspective view of the integrated motor and diagnostic apparatus according to the preferred embodiment of the invention.

The present invention will be described in the context of the exemplary integrated motor and diagnostic system 10 shown in FIG. 1. The integrated motor and diagnostic system 10 generally includes a motor and diagnostic unit 12, a supervisory computer 14, a central paging system 16, and a remote operator pager 18. The motor and diagnostic unit 12 is preferably connected to the supervisory computer 14 through a communication link 20. Similarly, the supervisory computer 14 is connected to the central paging system 16 through a commercial communication link 22. The central paging system 16 generally includes a local switchboard 24 and a remote broadcast tower 26 for generating an RF communication link signal 28 for delivery of alphanumeric messages or other signals or information from the supervisory computer 14 through the commercial communication link 22 and in turn to the remote operator pager 18. In that manner, an operator may be alerted to the condition of the motor and diagnostic unit 12 from a remote location.

With continued reference to FIG. 1, the motor and diagnostic unit includes an electric motor 30 having an output shaft 32 connected to a load 34. The electric motor 30 receives power from a remote power source (not shown) through a set of power lead wires 36. In addition, the motor and diagnostic unit 12 includes a diagnostic apparatus 40 integrated into the electric motor 30. The diagnostic apparatus 40 provides an operator with a display device 42 for visually displaying various operating conditions of the motor 30. Further, the diagnostic apparatus 40 includes a set of discrete motor condition display indicia including a fault indicia 44, a caution indicia 46 and a normal operation indicia 48. Lastly, in order to communicate with the supervisory computer, the motor and diagnostic unit 12 includes a communication port 50 for interfacing the diagnostic apparatus 40 with the supervisory computer 14 via the communication link 20. The link 20 preferably adheres to the RS232C standard for communicating command and parameter information.

Figure 2:
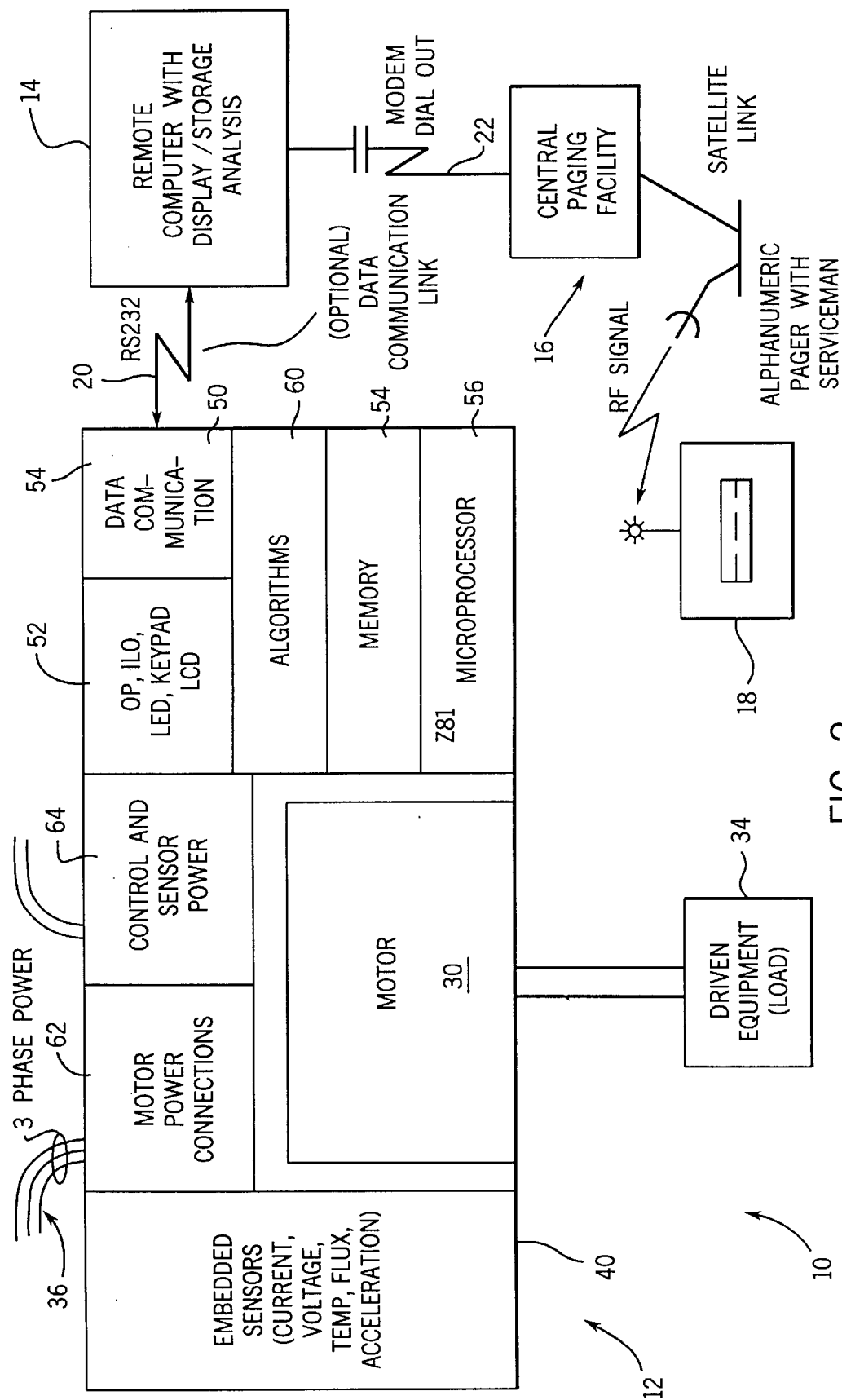
FIG. 2 is a functional schematic diagram of the motor and integrated diagnostic apparatus illustrated in FIG. 1.

FIG. 2 shows a function block schematic representation of the system illustrated in FIG. 1 including the motor and diagnostic unit 12 connected to the load 34 through the output shaft 32 comprising the electric motor 30. As illustrated, the diagnostic apparatus 40 is connected to the supervisory computer 14 via a communication link 20 through the communication port 50 provided in the diagnostic apparatus 40. The supervisory computer 14 is connected to the central paging system 16 through a commercial communication link 22. Preferably, the supervisory computer 14 includes an internal modem whereby communication with the central paging system 16 is via standard commercial telephone system using standard dial-up techniques. Lastly, the alphanumeric pager 18 is illustrated.

With continued reference to FIG. 2, the diagnostic apparatus 40 includes a plurality of functional subsystems including a signal communicating unit 54 having a pair of subsystems namely, the communication port 50 described above and, in addition, a man machine interface 52, commonly referred to in the art as an "MMI". The communication port 50 and the man machine interface 52 collectively form the signal communicating unit 54. A processor unit 56 executes various diagnostic algorithms stored in an algorithm memory 60 and performs various diagnostic calculations utilizing a data memory 54. An interface to the motor power lead wires 36 is provided by a motor power connection interface 62. In addition, an interface is provided to a plurality of embedded sensors which will be described below through an embedded sensor interface 64. Lastly, power is provided to the processor unit and to other components forming the diagnostic apparatus 40 from a control and sensor power unit 66.

Figure 3:
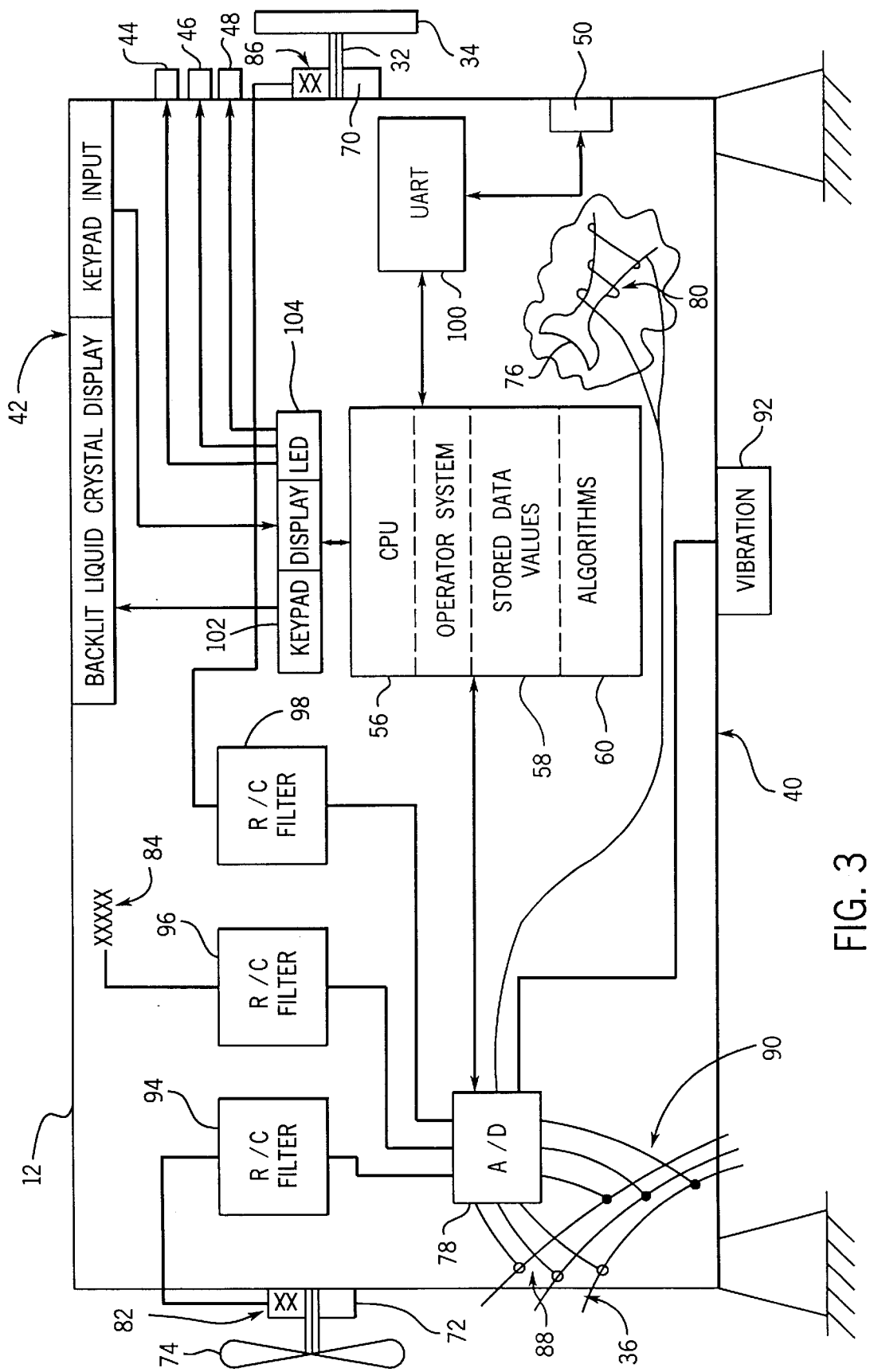
FIG. 3 is a schematic diagram of the integrated motor and diagnostic apparatus illustrated in FIG. 2.

FIG. 3 is a schematic representation of the motor and diagnostic unit 12 shown in its preferred application wherein the diagnostic apparatus 40 is integrated within a three phase induction motor 30. The induction motor illustrated includes a load bearing 70 on a front end thereof and a fan bearing 72 on the back end thereof. The output shaft 32 connects the load 34 to the motor 30. Similarly, the other end of the output shaft connects a fan 74 to the motor 30. The fan bearing 72 is on the same end of the motor as is the fan 74. Correspondingly, the load bearing 70 is on the same end of the motor as is the load 34. Also illustrated in FIG. 3 is a cut away sectional view of the motor exposing a stator tooth 76 of the induction motor having an air gap flux sensor 80 connected thereto for purposes described in greater detail immediately below.

The air gap flux sensor 80 is connected to the processor unit 56 via an analog to digital converter 78. The analog to digital converter converts the analog signals generated by the plurality of sensors including the air gap flux sensor 80 into a digital value for ready use by the processor unit 56. Other analog sensors connected to the processor unit 56 via the analog to digital converter 78 include a fan bearing temperature sensor 82, a stator temperature sensor 84, a load bearing temperature sensor 86, a set of motor current sensors 88, a set of motor voltage sensors 90, and a vibration sensor 92. The fan bearing temperature sensor 82, the stator temperature sensor 84, and the load bearing temperature sensor 86 are each preferably bi-metallic thermocouple-type sensors for generating an analog voltage proportional to the temperature at the thermocouple lead.

Each of the temperature sensors are preferably embedded into the target apparatus such as by drilling a hole into the stator core for providing a space to lodge the stator temperature sensor 84. After the stator temperature sensor 84 is lodged into the hole provided therefore in the stator, a suitable epoxy material is disposed into the hole to fill the void providing a good mechanical and thermal connection between the stator temperature sensor 84 and the stator core into which the sensor is embedded. Similarly, each of the bearing temperature sensors 82, 86 are preferably embedded into their respective bearing components. Alternatively, the temperature sensors may be mounted into the motor end brackets near the bearing components. As illustrated in the figure, the thermocouple temperature sensors 82, 84, 86 are connected to the analog to digital converter 78 through the filter devices 94, 96, 98. Each of the filters 94, 96, 98 provide a buffer to smooth any transience that might be experienced by the thermocouple temperature sensors. Preferably, the buffer proves an RC time constant large enough to mask high frequency noise on the thermocouple inputs.

With continued reference to FIG. 3, the analog to digital converter 78 includes a set of motor current sensors 88 and a set of motor voltage sensors 90. Each of these sets of sensors are connected directly to the power lead wires 36 connecting the electric motor 30 to a source of power. Preferably, the motor current sensors 88 are arranged as current transformers on each power line to generate a voltage proportional to the current flowing through the respective power lead wire. Further, each of the motor voltage sensors 90 preferably includes a voltage division circuit such as a resistor bridge circuit for providing an analog voltage signal to the analog to digital converter 72 which is within the operating range of the converter. Preferably, the voltage conditioned by the divider circuit remains proportional to the incoming power voltage on the power lead wires 36.

The air gap flux sensor 80 is illustrated as being wrapped around a stator tooth 76 of the stator of the electric motor 30. The air gap flux sensor 80 provides a voltage proportional to the flux experienced at the stator tooth. One or more stator teeth may be selected to provide inputs along the axial length of the stator of the motor or circumferentially around the stator, or both. In some applications, it may be desirable to arrange multiple flux sensors or, alternatively, to monitor only the peak inputs from the multiple sensors.

Lastly, a vibration sensor 92 is mechanically connected to the casing of the motor 30 to provide a voltage signal proportional to the amount of vibration experienced by the motor. As illustrated, the vibration sensor 92 is connected to the motor casings at a central location. However, one or more vibration sensors may be disposed about the various internal and/or external surfaces of the motor to provide one or more vibration signals. The analog signals from the vibration sensors are converted to digital signals by the A/D mechanism 78 for use by the processor unit 56.

With yet continued reference to FIG. 3, the processor unit 56 executes various diagnostic algorithms from programs stored in an algorithm memory 60. Further, the processor unit 56 utilizes a data memory 58 to perform various calculations and to store variables. A universal asynchronous receiver and transmitter 100, commonly referred to in the art as "UART", is connected to the communication port 50 described above. In addition, the signal communicating unit 54 includes a keypad and display driver unit 102 and LED driver unit 104. The keypad/display driver unit 102 provides suitable signal conditioning a logical interface between the processor unit 56 and the display unit 42. Preferably, the display device 42 is a back lit liquid crystal display having a 2×24 character display. Similar to the above, the LED driver unit 104 provides a suitable logical interface and signal conditioning and the processor unit 56 and the set of display indicia on the diagnostic apparatus 40 including the fault indicia LED 44, the caution indicia LED 46, and the normal operation indicia LED 48.

Figure 4:
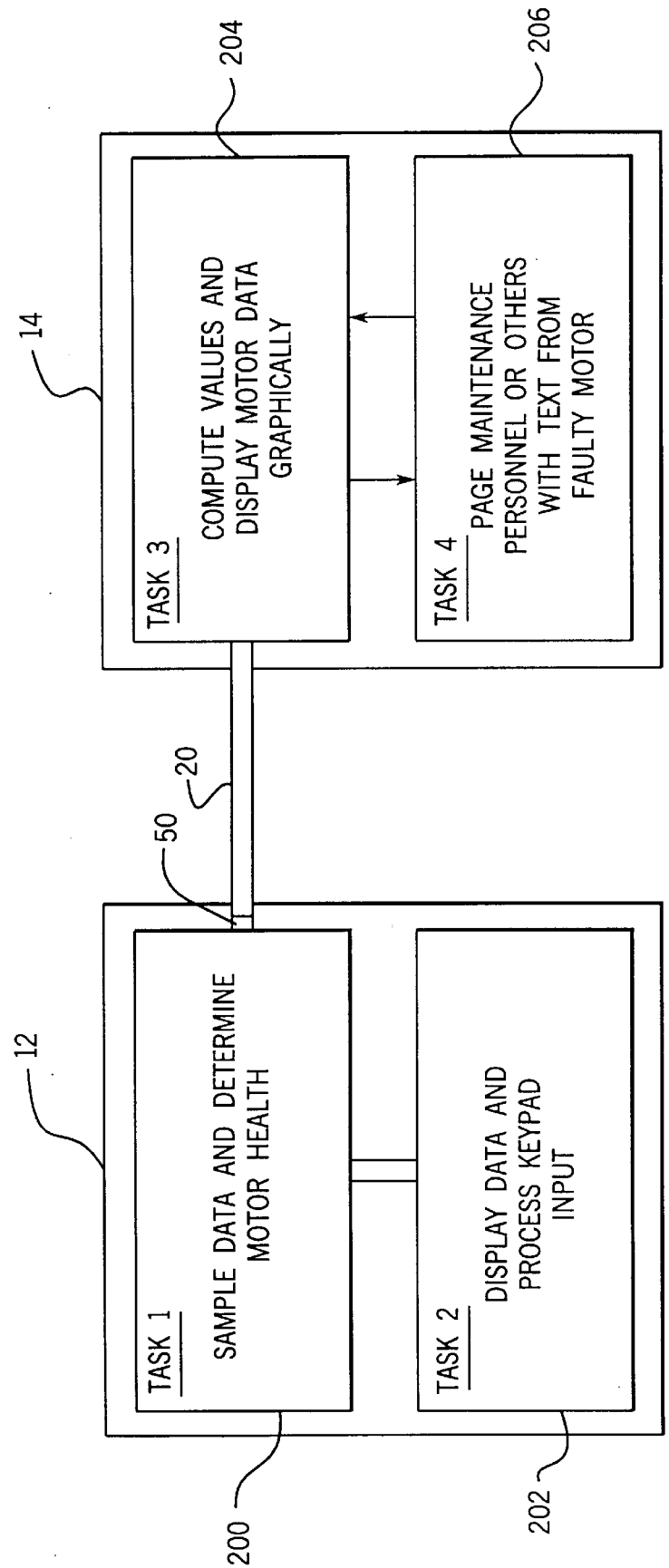
FIG. 4 is a diagram showing the respective intelligent tasks performed by the components comprising the motor and diagnostic apparatus system illustrated in FIG. 1.

With reference now to FIG. 4, the functional operation of the integrated motor and diagnostic system 12 will be described first with particular reference to the functional operation of the motor and diagnostic unit 12 and then with reference to the functional operation of the supervisory computer 14.

Both the motor and diagnostic unit 12 and the supervisory computer 14 execute a respective set of instructions and logical operations in order to effect the motor diagnostic functions according to the present invention. Although the operation of the motor and diagnostic unit will be discussed in conjunction with the operation of the supervisory computer below, it is to be noted that according to the present invention, the motor and diagnostic unit 12 may be operated independent of the supervisory computer 14 such as when the communication link 20 is disconnected or during other conditions where the supervisory computer 14 is not necessary. Further, the supervisory computer is adapted to interface a plurality of motor and diagnostic units with one or more central paging systems. In addition, a plurality of diagnostic units may be connected to a plurality of supervisory computers which are in turn connected to a plurality of central paging systems. For convenience, the singular case/toplogy will be used to explain the invention.

The motor and diagnostic unit 12 executes a set of logical operations which may generally be grouped into a first task 200 and a second task 202. The first task 200 comprises those operations which sample data and determine the health of the electric motor 30. The second task 202 comprises those operations which display the collected and computed data and in addition, those tasks which process keypad input and output information. An operating system task (not shown) in the motor and diagnostic unit 12 operates generally to call the first task 200 and then, upon a return from task one, the operating system calls task two 202. Thus, the operating system in the motor and diagnostic unit 12 calls the tasks 200, 202 in an alternating fashion.

With continued reference to FIG. 4, the supervisory computer 14 includes an operating system as well (not shown) which includes the basic functions necessary to operate the supervisory computer 14 including a display unit, a keyboard, disk drives and a modem. Preferably, the supervisory computer is PC based and therefore the operating system is preferably one of the commercially available systems such as DOS, Windows, or Windows 95. The operating system within the supervisory computer 14 periodically calls task three 204 which generally comprises those operations which compute various parameter values and display motor data on the supervisory computer in a graphical form. A fourth task 206 in the supervisory computer 14 is selectively launched by the third task 204 in the supervisory computer 14 when it becomes necessary to page a human operator such as a maintenance engineer with textual information or to send other data indicative of a faulty motor or for other reasons which may require the attention of the human operator. Thus, the fourth task 206 includes the programming necessary to interface the supervisory computer 14 with the central paging system 16 via a modem or the like in the supervisory computer 14.

Figure 5:
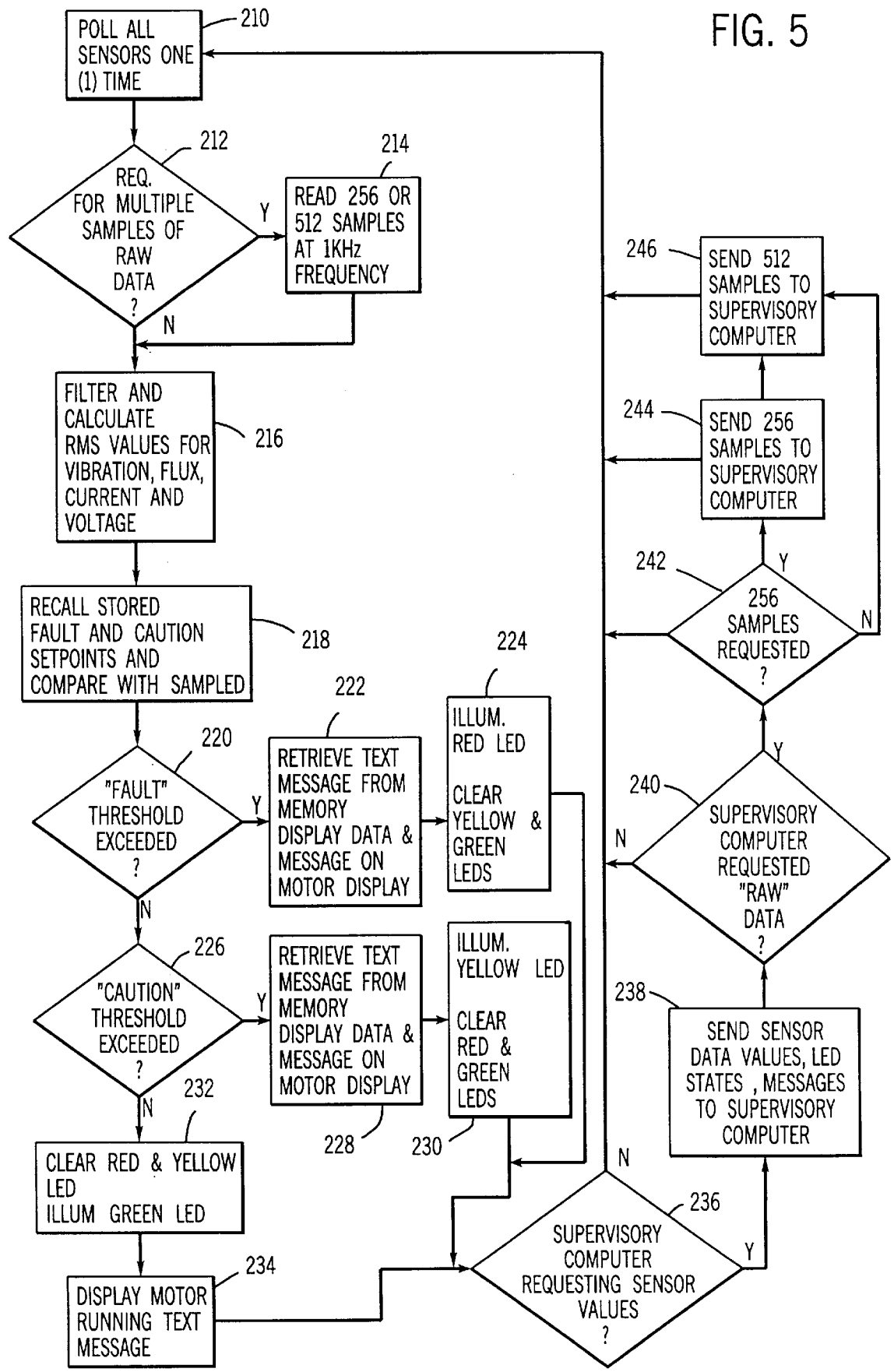
FIG. 5 is a flow chart illustrating a first control and diagnostic function executed by the motor of the system illustrated in FIG. 4.

With reference now to FIG. 5, the first task 200 executed in the motor and diagnostic unit 12 will be described in detail. Initially, as a first step 210 during the execution of the first task 200, each of the plurality of sensors is polled for their values by the processor unit 56 and the A/D converter 78. In step 210, all of the thermocouple sensors are polled as well as the air gap flux sensor and the voltage and current sensors.

Next, in step 212, a flag (not shown) in the data memory 58 is inspected to determine whether multiple samples of raw data are required to be polled. In the event that multiple samples of raw data are required as determined by the flag in the memory, a plurality of raw samples are polled by the processor unit and A/D converter in step 214. A second flag in the data memory 58 is inspected to determine whether 256 or 512 samples are taken. In either case, the multiple raw sample data is polled at 1 KHZ into the data memory 58.

In the event that multiple samples of raw data are not required, the first task 200 immediately transfers control to step 216 whereat the plurality of sensor value data obtained at step 212 is first filtered through the RC filters 94, 96, 98 or through software means and then manipulated in order to calculate root mean squared RMS values for motor vibration, motor voltage, motor current and flux parameter values. In step 216, the RMS values are for the various motor parameters including vibration, voltage, current and flux values are determined according to well known techniques. The RMS values for each of the parameters are stored in the data memory 58 of the motor and diagnostic unit 12.

Having obtained and stored the various RMS parameter values, respective sets of previously stored threshold values for those parameters are inspected at step 218 in order to determine a comparison between the previously stored threshold values and the calculated values. The previously stored threshold values include ranges for motor fault conditions, a range for a motor caution condition, and a range for a normal operating condition. Each of the vibration, voltage, current and flux parameters are assigned a range of fault, caution, and normal operation threshold values in the data memory 58 such as through the keypad and display device 42 in a manner described below.

In step 220, the calculated RMS values for vibration, voltage, current and flux parameters are compared against the previously stored fault threshold values for same. If any of the calculated RMS parameters exceed their respective fault threshold values, a message text is retrieved in step 222 from the data memory 58 and in turn displayed on the input and display device 42. As an added precaution and in order to announce the fault condition in a more apparent manner, the fault indicia LED 44 is illuminated in step 224. If only a single parameter indicates a motor fault, the task may selectively monitor only that particular faulty parameter ignoring the other raw data sensor inputs. A benefit is that a greater level of resolution is obtainable.

In step 226, the calculated RMS values for vibration, voltage, current and flux parameters are compared against previously stored caution threshold values. If any of the calculated RMS values for vibration, voltage, current or flux exceed the previously determined caution threshold values, a textual message is retrieved from the data memory 58 and the retrieved message as well as the calculated RMS value exceeding the caution is displayed on the input and display device 42. As with the fault condition, in order to more emphatically emphasize the caution condition, the caution indicia LED 46 is illuminated in step 230.

In the event that each of the calculated RMS values for vibration, voltage, current and flux parameters do not exceed either the fault threshold range or the caution threshold range, each of the fault and caution indicia LEDs 44, 46 are cleared in step 232. In that event, the normal operation indicia LED 48 is illuminated. Further, in the event that no faults or caution conditions are found to exist, a motor running message is displayed on the input and display device 42 at step 234.

The first task 200 determines at step 236 whether the supervisory computer 14 is connected to the motor and diagnostic unit 12 via the communication link 20 at step 236. If it is determined that the supervisory computer is connected to the motor and diagnostic unit and further that the supervisory computer is requesting one or more sensor parameter values at step 236, the motor and diagnostic unit 12 transmits the requested sensor value data to the supervisory computer at step 238. In that event, the motor and diagnostic unit transmits the calculated RMS values for vibration, voltage, current and flux parameters as well as the status of the fault, caution, and normal operation indicia LEDs.

In step 240, the first task 200 determines whether the supervisory computer 14 has lodged a request for the raw data collected at step 212. If such a request has been lodged, it is determined in step 242 whether 256 samples are requested. If the smaller sample collection is requested, it is transmitted to the supervisory computer at step 244. However, in the event that the larger data set is requested, the raw sample data is transmitted from the data memory 58 of the motor and diagnostic unit to the supervisory computer at step 246.

Figure 6:
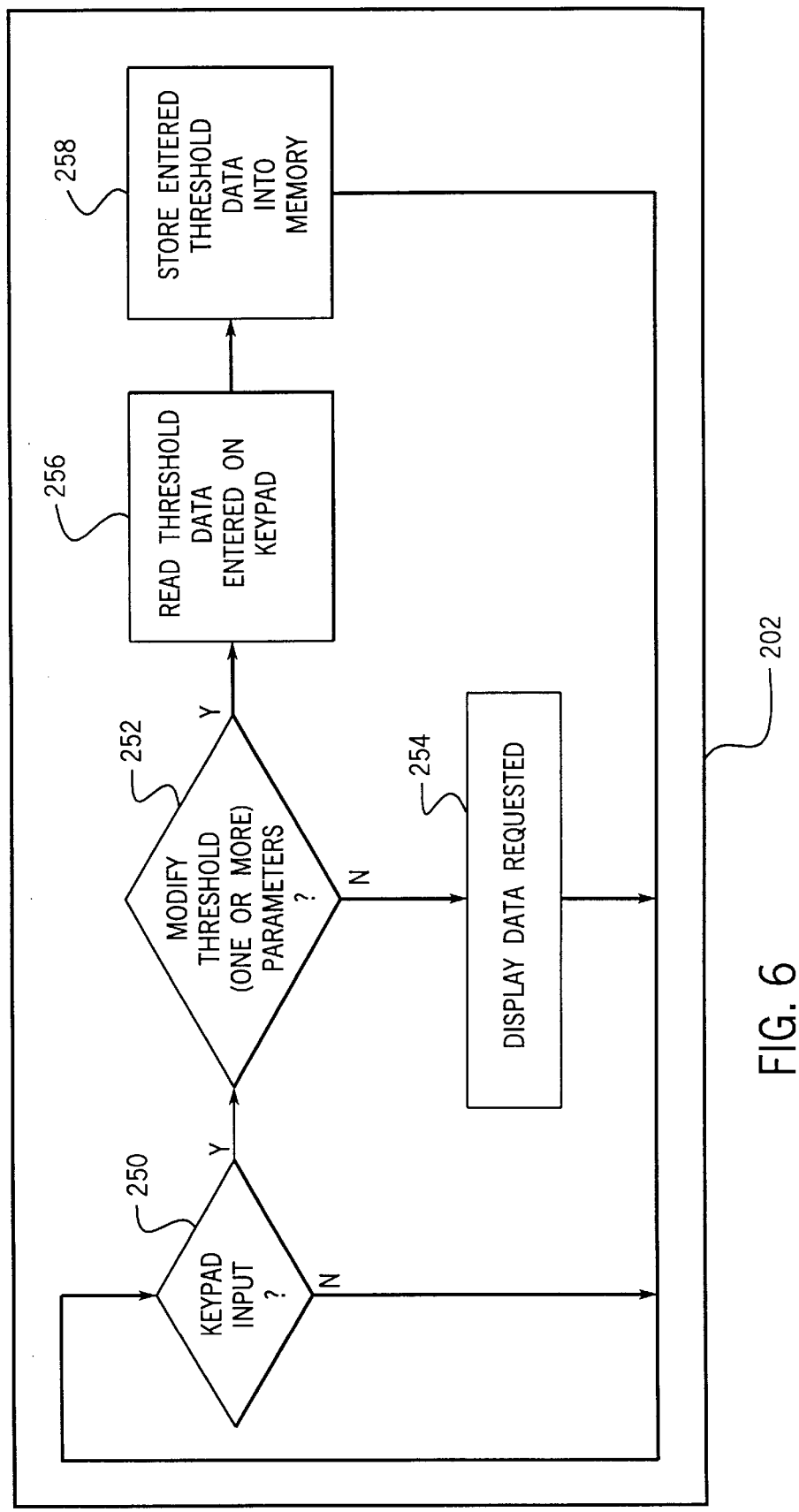
FIG. 6 is a flow chart illustrating a second control and diagnostic function executed by the motor of the system illustrated in FIG. 4.

As indicated above, the operating system within the motor and diagnostic unit alternately calls the first task 200 and the second task 202. After completing execution of the first task 200 in the manner described above, the second task 202 shown in FIG. 6 is then executed by the motor and diagnostic unit. In the second task 202, the motor and diagnostic unit determines in step 250 whether the status of the keypad input on the input and display device has changed since the previous execution of the second task. In the event that the status has changed, it is determined in step 252 whether any of the fault or caution threshold values stored in the data memory 58 are to be changed. If not, the requested data is displayed on the input and display device 42 at step 254. However, if one or more threshold values are to be changed, the new value is read at step 256 and entered into the data memory 58 at step 258. In the above manner, operator requested data is displayed on the input and display device 42 and, further, new threshold parameter data is entered into the data memory 58 of the motor and diagnostic unit 12 through the input and display device 42.

Figure 7:
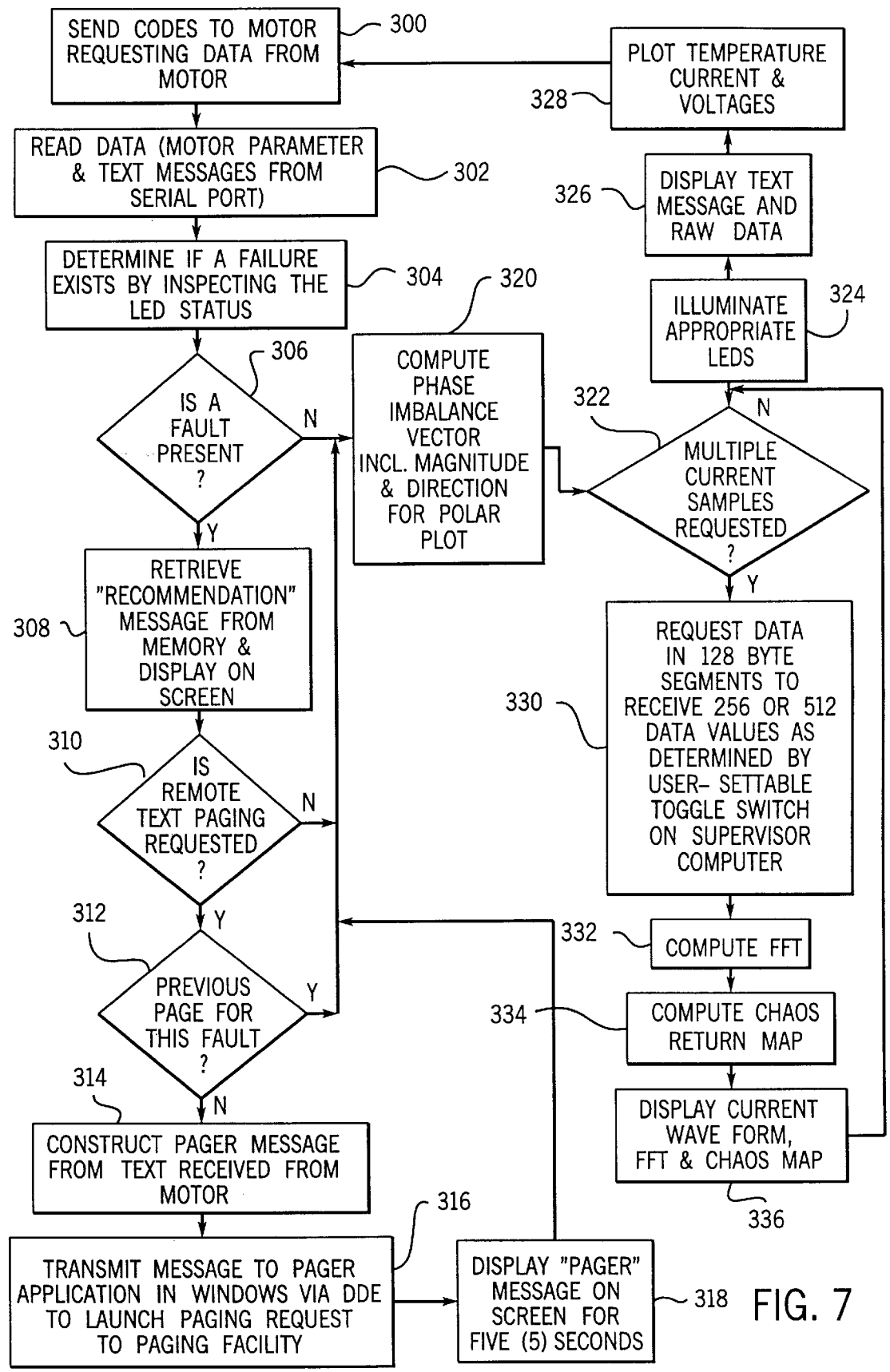
FIG. 7 is a flow chart illustrating a first control and diagnostic task executed by the supervisory computer of the system illustrated in FIG. 4.

With reference now to FIG. 7, the third task 204 will be described in detail. Initially, in the event that the supervisory computer has a need for parameter value data, a request code is transmitted to the motor and diagnostic unit at step 300 requesting one or more data types or sets of parameter data from the data memory 58. After transmitting the request code, the supervisory computer 14 reads the data from the motor and diagnostic unit transmitted via the communication link 20. Typically, the data includes motor parameter data and text messages as well as the status of the fault, caution and normal operation indicia LEDs. FIG. 8 illustrates the preferred data types and further, illustrates the preferred data characteristics communicated between the motor and diagnostic unit 12 and the supervisory computer 14.

With continued reference to FIG. 7, step 304 of the third task 204 determines whether a failure or fault condition exists by inspecting the status of the transmitted fault indicia information (red LED item or yellow LED item in FIG. 8). If a fault condition is determined to be present in step 306, the supervisory computer 14 retrieves a recommendation message in step 308 from a memory location (not shown). The retrieved recommendation message is displayed on a screen connected to the supervisory computer. After displaying the recommendation message on the screen, it is next determined in step 310 whether a remote text paging is requested as determined by a flag (not shown) previously stored in the supervisory computer. If it is determined in step 312 that the page request has not already been acted on for the particular fault, a pager message is constructed in step 314 primarily from the text received from the motor and diagnostic unit. Next, in step 316, the pager message is transmitted through the operating system of the supervisory computer and by launching the fourth task 206 to transmit the page request to the central paging system 16 via the commercial communication link 22. Preferably, the paging request is executed by the fourth task 206 as a background process. In addition, the fourth task executing in the background preferably includes intelligence to selectively transmit the fault message to the appropriate personnel. In that regard, serious fault messages may be transmitted to a supervisory maintenance operator. On the other hand, mere cautionary messages may be transmitted to machine operators or other personnel for the exercise of the appropriate corrective action. Lastly, in step 318, the supervisory computer displays the message intended to be transmitted to the remote operator pager 18 on a screen of the supervisory computer.

In step 306 if it is determined that a fault is not present based upon the data transmitted from the motor and diagnostic unit, the supervisory computer computes at step 320, a phase imbalance vector including phase magnitude and direction, in order to display a polar plot of the phase voltage and current on a display screen of the supervisory computer. If it is determined in step 322 that multiple current samples were not requested from the motor and diagnostic unit, graphical representations of the fault, caution and normal operation indicia LEDs are illuminated on a display screen of the supervisory computer in step 324. Further, in step 326, a textual message as well as the raw parameter data values are displayed on a display screen of the supervisory computer. Lastly, a plot of the temperature, current, and/or voltage values are displayed on the display unit of the supervisory computer in step 328.

If, in step 322, it is determined that multiple current samples were requested, additional data is requested from the motor and diagnostic unit in 128 byte segments in step 330. A fast fourier transform FFT is next calculated in step 332. In addition, a complete chaos return map is computed in step 334 using the requested data in 128 byte segments. Lastly, in step 336, one or more of the current wave form, fast fourier transform, and chaos map is displayed on a display unit of the supervisory computer 14.

Figure 9:
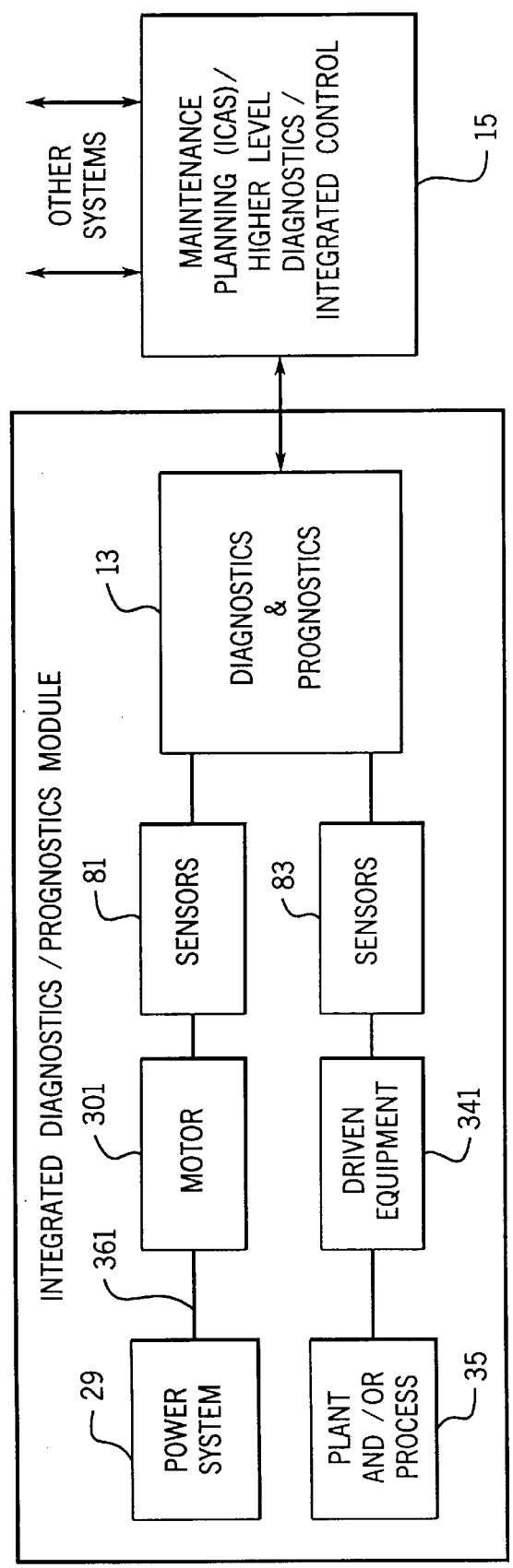

FIG. 9 illustrates the present invention in an application extending the diagnosis to include condition-based maintenance of machinery which is system-wide in scope and includes effective condition monitoring and analysis. An electric motor 30' receives power from a power system 29 through a set of power lead wires 36'. The motor 30' is connected to a load 34' which may be any piece of driven equipment. The article of driven equipment or load 34' is in turn connected to other pieces of equipment in a plant and/or process 35. A plurality of motor sensors 81 are connected to the motor 30' in a manner described above with respect to the temperatue sensors, the vibration sensor and the current and voltage sensors. In addition, a plurality of load sensors 83 are connected to the article of driven equipment or load 34'. The plurality of motor sensors 81 and the plurality of load sensors 83 are each in turn connected to a diagnostics and prognostics apparatus 13. The diagnostics and prognostics apparatus 13 is in turn connected to a higher level maintenance planning or integrated control system 15.

The diagnostics and prognostics apparatus 13 utilize various analytic techniques such as those which generally fall under the category of current signature analysis which has been shown to detect certain mechanical problems such as bearing failure, rotor problems and electrical insulation breakdown. Powerful filtering and other signal processing and classification algorithms are used by the diagnostic and prognostic apparatus 13 to relate sample sensor information to a plant model for root cause analysis and lifetime prediction. Both qualitative and quantitative motor, driven equipment, and system models are utilized.

The prognostication performed in the apparatus 13 of the future state of the system is in terms of both physical condition such as stator insulation and estimate of degradation rates and operation impact as a function of degradation. This prognostication not only protects equipment and insures operational readiness, it also allows integrated motor control centers to adjust system usage for optimum machinery system performance or to achieve targeted machinery life. The prognostication of system degradation executed in the unit 13 allows maintenance planning to proceed in a efficient manner to provide optimum plant system utilization. Several analytical methods are implemented in the unit 13 to accurately perform machinery diagnostics and prognostics. The system illustrated in FIG. 9 includes pattern recognition routines, signal classification algorithms, and models (both qualitative and quantitative) of the machine components and the machinery in its entirety. It is contemplated that all of these techniques and combinations be used in the system described in detail above and shown in FIGS. 1–8.

While particular embodiments of the present invention have been shown and described, it should be clear that changes and modifications may be made to such embodiments without departing from the true scope and spirit of the invention. It is intended that the appended claims cover all such changes and modifications.

Having thus described the preferred embodiments of the invention, we now claim:

1. An integrated motor and diagnostic system comprising:
   an electric motor including a rotor, a stator, at least one bearing supporting the rotor, and a plurality of motor lead wires carrying electrical current to the motor; and,
   a diagnostic unit integrated into the electric motor, the diagnostic unit including:
   at least one sensor on the motor for measuring a first physical condition of the motor and generating a first physical condition signal based on said measured fist physical condition;
   a memory element including an FFT based diagnostic algorithm;
   a processing unit coupled to said memory element and to said at least one sensor, said processing unit performing a diagnostic assessment of the motor based on said first physical condition signal and the diagnostic algorithm and generating a diagnostic signal; and,
   a signal communicating unit coupled to the processing unit for communicating the diagnostic signal from the diagnostic apparatus.

2. The integrated motor and diagnostic system according to claim 1 wherein:
   said diagnostic unit further comprises a plurality of sensors on the motor for measuring a plurality of first physical conditions of the motor and generating a plurality of first physical condition signals based on said plurality of first physical conditions; and,
   said processing unit is connected to said plurality of sensors for determining said diagnostic assessment of the motor based on first preselected ones of said plurality of first physical condition signals and the diagnostic algorithm.

3. The integrated motor and diagnostic system according to claim 2 wherein said plurality of sensors include a set of sensors selected from the group consisting of a vibration sensor, a thermocouple sensor, an electric current sensor, an electric voltage sensor and a magnetic flux sensor.

4. The integrated motor and diagnostic system according to claim 1 further comprising a supervisory computer device operatively connected to the signal communicating unit for receiving said motor diagnostic signal from the signal communicating unit and selectively generating a diagnostic message based on said motor diagnostic signal.

5. The integrated motor and diagnostic system according to claim 4 wherein said supervisory computer device is adapted to communicate said diagnostic message to an operatively associated commercial pager system for transmission to a remote alphanumeric pager device.

6. The integrated motor and diagnostic system according to claim 1 wherein the processing unit includes means for comparing said diagnostic signal with a first operating condition parameter stored in said memory.

7. The integrated motor and diagnostic system according to claim 6 wherein the signal communicating unit includes an operator interface having an input unit for receiving said first operating condition parameter into the system and an output unit for displaying said motor diagnostic signal.

8. The integrated motor and diagnostic system according to claim 7 wherein:
   the input unit of the said operator interface includes means for receiving said first operating condition parameter from an operatively associated supervisory controller; and,
   the output unit of said operator interface includes means for transmitting said motor diagnostic signal to said operatively associated supervisory controller.

9. The integrated motor and diagnostic system according to claim 1 wherein:
   said system further comprises a plurality of sensors on the motor for measuring a plurality of first physical conditions of the motor and generating a plurality of first physical condition signals based on said plurality of measured first physical conditions; and,
   said processing unit includes means for dynamically adjusting a sampling rate of selective ones of said plurality of sensors based on an operating condition of the motor.

10. The integrated motor and diagnostic system according to claim 1 wherein said electric motor includes a housing adapted to integrally couple with said diagnostic unit.

11. An integrated motor and diagnostic system comprising:
    an electric motor including a rotor, a stator, at least one bearing supporting the rotor and, a plurality of motor lead wires carrying electric current to the motor; and,
    a diagnostic unit integrated into the electric motor, the diagnostic unit including:
       at least one sensor measuring a first physical condition of the motor and generating a first physical condition signal based on said measured first physical condition;
       a memory element including a pattern recognition based diagnostic algorithm;
       a processing unit coupled to said memory element and to said at least one sensor, said processing unit performing a diagnostic assessment of the motor based an said first physical condition signal and the diagnostic algorithm and generating a diagnostic signal; and,
       a display device integrated into the electric motor and adapted to visually display said diagnostic signal of the motor.

12. The integrated motor and diagnostic system according to claim 11 further comprising a signal communicating unit responsive to the processing unit for communicating said diagnostic signal from the integrated motor and diagnostic system to an operatively associated external supervisory computer device.

13. The integrated motor and diagnostic system according to claim 12 further comprising a supervisory computer device operatively connected to the signal communicating unit for receiving said diagnostic signal from the signal communicating unit and selectively generating a diagnostic message at the supervisory computer device based on said first operating condition signal.

14. A integrated motor and diagnostic system comprising:
    an electric motor including a rotor, a stator, at least one bearing supporting the rotor and, a plurality of motor lead wires carrying electric current to the motor; and,
    a diagnostic unit integrated into the electric motor, the diagnostic unit including:
       a plurality of sensors measuring a plurality of physical conditions of the motor and generating a plurality of physical condition signals based on said measured plurality of physical conditions;
       a memory element including an FFT based diagnostic algorithm;
       a processing unit coupled to said memory element and to said plurality of sensors, said processing unit performing a diagnostic assessment of the motor based on said plurality of physical condition signals and said diagnostic algorithm and generating a diagnostic signal; and,
       a signal communicating unit responsive to the processing unit and adapted to communicate said physical condition signal and said diagnostic signal from the diagnostic apparatus to an operatively associated external device.

15. The integrated motor and diagnostic system according to claim 14 further comprising a supervisory computer device operatively connected to the signal communicating unit adapted to receive said diagnostic signal from the signal communicating unit and selectively generate a diagnostic message at the supervisory computer device based on said diagnostic signal.

16. The integrated motor and diagnostic system according to claim 15 wherein said diagnostic unit includes a display device integrated into the electric motor and adapted to visually represent said diagnostic signal.

17. The integrated motor and diagnostic system according to claim 16 wherein said plurality of sensors include a set of sensors selected from the group consisting of a vibration sensor, a thermocouple sensor, an electric current sensor, an electric voltage sensor and a magnetic flux sensor.

18. A motor diagnostic system comprising:
    an electric motor;
    a diagnostic unit integrated into said motor, said diagnostic unit comprising,
       at least one sensor measuring a first physical condition of the motor and generating a first physical condition signal based an said first physical condition;
       a memory element including a motor model based diagnostic algorithm;
       a processing unit coupled to said memory element and to said at least one sensor, said processing unit performing a diagnostic assessment of the motor based on said first physical condition signal and the diagnostic algorithm and generating a diagnostic signal; and
       a remote signal communications interface coupled to the processing unit for communicating said diagnostic signal and said first physical condition signal.

19. The motor diagnostic system according to claim 18 further comprising a supervisory computer device operatively connected to the remote communications interface for receiving said first physical condition signal from the interface and selectively generating a diagnostic message at the supervisory computer device based on said first physical condition signal.

* * * * *